(12) United States Patent
Trioli et al.

(10) Patent No.: US 6,738,262 B2
(45) Date of Patent: May 18, 2004

(54) PORT FILLER BAFFLE

(75) Inventors: Philip Mathew Trioli, New Boston, NH (US); Scott A. Leclerc, Ashby, MA (US)

(73) Assignee: Sycamore Networks, Inc., Chelmsford, MA (US)

( * ) Notice: Subject to any disclaimer, the term of this patent is extended or adjusted under 35 U.S.C. 154(b) by 0 days.

(21) Appl. No.: 09/862,218

(22) Filed: May 21, 2001

(65) Prior Publication Data

US 2002/0172020 A1 Nov. 21, 2002

(51) Int. Cl.[7] .............................. H05K 5/00; H05K 5/04
(52) U.S. Cl. ...................... 361/753; 361/797; 361/802; 361/730; 361/825
(58) Field of Search .................. 361/753, 797, 361/800, 802, 825, 729, 730, 708, 796, 752, 798

(56) References Cited

U.S. PATENT DOCUMENTS

| | | | | |
|---|---|---|---|---|
| 4,489,363 A | * | 12/1984 | Goldberg | 174/16.1 |
| 4,935,845 A | * | 6/1990 | Schwehr et al. | 361/694 |
| 5,204,496 A | * | 4/1993 | Boulay et al. | 174/35 GC |
| 5,613,906 A | * | 3/1997 | Kikinis | 361/678 |
| 5,756,937 A | * | 5/1998 | Gleadall | 174/138 F |
| 6,320,752 B1 | * | 11/2001 | Jang | 361/740 |
| 6,411,511 B1 | * | 6/2002 | Chen | 361/697 |
| 6,512,672 B1 | * | 1/2003 | Chen | 361/695 |

* cited by examiner

Primary Examiner—David Martin
Assistant Examiner—Hung Bui
(74) Attorney, Agent, or Firm—Lahive & Cockfield, LLP

(57) ABSTRACT

An apparatus for hindering the collection of dust and particulate matter within unutilized housings or ports of hardware component chassis is provided. A port filler baffle for occupying a port within a chassis includes a panel assembly sized and dimensioned to fit within the port of the chassis. A bracket couples with the panel assembly. An aperture filler couples with the bracket. The aperture filler is disposed to hinder particulate intrusion into the unutilized port of the chassis. When the panel assembly is mounted in the chassis, the aperture filler presses against the unutilized port, substantially blocking access to the inside of the port, thus hindering particulate intrusion and keeping the port clean.

33 Claims, 5 Drawing Sheets

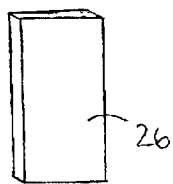
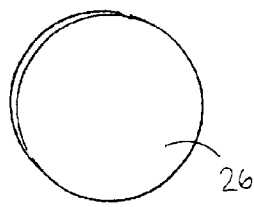
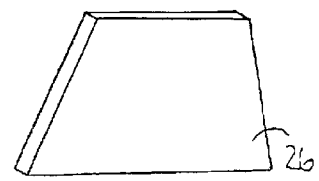
FIG. 2A  FIG. 2B  FIG. 2C
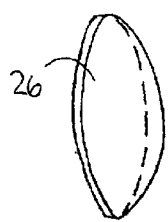
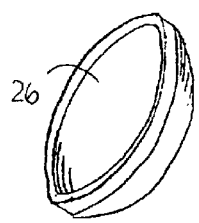
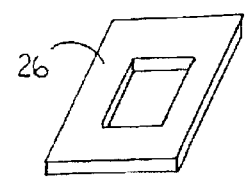
FIG. 2D  FIG. 2E  FIG. 2F
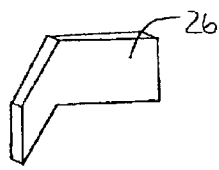
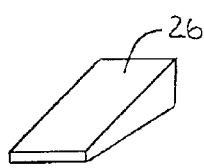
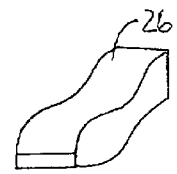
FIG. 2G  FIG. 2H  FIG. 2I

PORT FILLER BAFFLE

FIELD OF THE INVENTION

The invention relates to an optical switch compartment, and more particularly to a baffle for filling an empty port within the optical switch.

BACKGROUND OF THE INVENTION

Optical switches typically include a chassis for interconnecting optical cards and ports. The chassis may have a skeletal structure formed from a sheet of metal and may include an opening for each of a plurality of ports. The chassis typically has a predetermined maximum number of components, i.e., a maximum number of cards and/or a maximum number of ports that can interface with the chassis. When the maximum number of components are interfaced with the chassis, the chassis is "fully loaded". Often, however, the chassis is not fully loaded and thus one or more port openings remain unoccupied as do one or more slots for the optical cards.

Optical switches typically require cooling mechanisms such as one or more cooling fans to circulate air over one or more of the internal components of the optical switch. The circulating air helps to maintain desired operating temperatures. Typically, the air path for the fan or fans is designed for a fully loaded chassis, because when the chassis is fully loaded, the requirement for cooling is most often at a maximum. Therefore the cooling path, i.e., the path of the air flow from the fans, is designed for the fully loaded condition. If the hardware component chassis is filled with a number of internal components less than a maximum number, there may be one or more gaps within the hardware component chassis that distort the airflow from the cooling fans and redirect the cooling path. This can have the effect of reducing the cooling effectiveness of the cooling fans, and potentially lead to one or more of the internal components overheating because the cooling path is not reaching the components as required.

One known solution to this cooling problem is to provide one or more filler baffles within the hardware component chassis. The inclusion of the filler baffles takes the place of internal components having active elements (e.g. an optical card), without having to include the more expensive components when there is no use for the more expensive components. The filler baffle occupies a space equivalent to an internal component (e.g., an optical card) such that the air flow within the hardware component chassis propagates through the design cooling path and helps to maintain proper cooling levels.

When the filler baffles mount within the hardware component chassis, they do not contain the components that otherwise would interface with portions of the chassis. The lack of components and elements on the baffles leads to one or more unutilized ports, such as optical ports or housings. The ports are unutilized because there is no connector plugged into them from the baffle. The unutilized ports can collect dust if left open to the internal environment of the hardware component chassis, which is typically not airtight. The collection of dust requires a technician to clean out the ports when and if the ports are utilized at a later point in time.

SUMMARY OF THE INVENTION

There is a need for a mechanism to hinder the collection of dust within unutilized ports of hardware component chassis. The invention is directed to further solutions to address this need.

In accordance with an embodiment of the present invention, a baffle for occupying a port within a plane of a chassis includes a panel assembly sized and dimensioned to fit within the port of the plane. A bracket couples with the panel assembly. An aperture filler couples with the bracket. The aperture filler is disposed to hinder particulate intrusion into the unutilized port. When the panel assembly is mounted in the chassis, the aperture filler presses against the unutilized port to substantially block access to the inside of the port and thus hinder particulate intrusion (i.e., the accumulation of dust).

According to one aspect of the invention, the chassis can include at least one groove for slidingly mounting the baffle. The baffle, in such an embodiment, can include a tongue shaped edge suitable for sliding into the groove of the chassis.

According to a further aspect of the invention, the panel assembly can include a mounting bracket. The mounting bracket removably and replaceably couple with the panel. The mounting bracket can include at least one fastener suitable for coupling the panel assembly to the chassis.

According to another aspect of the present invention, an optical switch includes a chassis. A plane (i.e., a backplane or a mid-plane) is disposed within the chassis. The plane supports one or more ports, wherein at least one of the one or more ports is unutilized. A port filler baffle is disposed within the chassis and has a pad. The pad of the port filler baffle is disposed to press against the at least one unutilized port to seal the port and hinder the entrance of particulate matter into the port when the port filler baffle is installed into the chassis.

The optical switch can have ports that are one or more of apertures, connectors, fixtures, housings, and the like.

According to still further aspects of the present invention, an assembly includes a chassis. A plane having one or more apertures is disposed within the chassis. A panel assembly is also disposed within the chassis. A support bracket is disposed on the panel assembly that includes an aperture filler disposed thereon, such that the aperture filler hinders particulate matter from entering the aperture.

The pad can be constructed of a deformable material suitable for sealing, such as silicone foam, and can be mounted to the support bracket with adhesive.

BRIEF DESCRIPTION OF THE DRAWINGS

The aforementioned features and advantages, and other features and aspects of the invention, will become better understood with regard to the following description and accompanying drawings, wherein:

FIGS. 2A–2I are illustrative embodiments of a port filler baffle pad in accordance with multiple embodiments of the invention;

DETAILED DESCRIPTION

Figure 1:
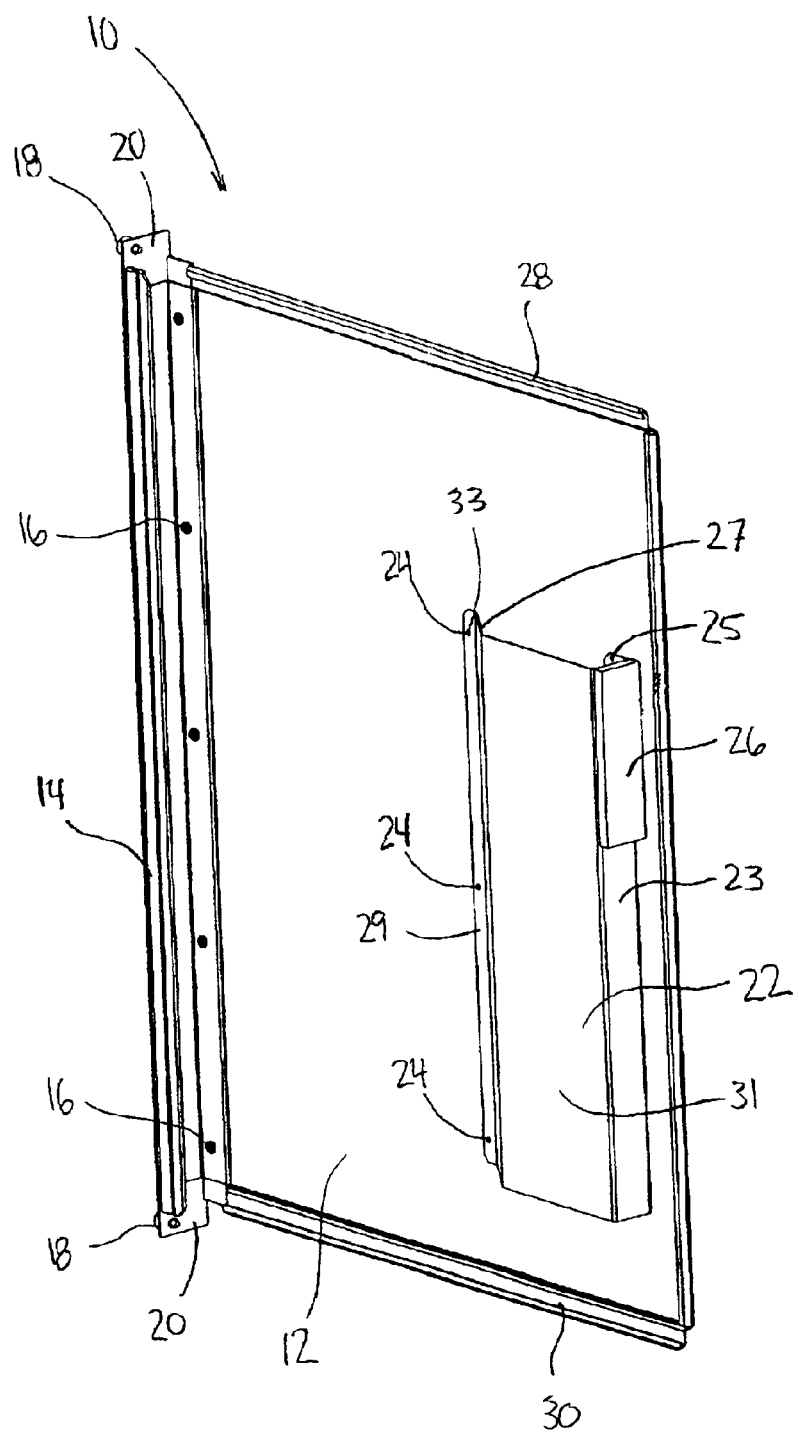
FIG. 1 is a perspective view of a port filler baffle in accordance with one embodiment of the invention.

The invention generally relates to a baffle for occupying a port within a chassis. The port is typically disposed within a plane of the chassis. The baffle occupies a space within the chassis that is otherwise occupied by an active component mounted on a board. A panel assembly is sized and dimensioned to fit within the port. A bracket couples to the panel assembly and an aperture filler couples with the bracket. The aperture filler is disposed to hinder particulate intrusion into the chassis. The addition of the bracket and aperture filler reduces the likelihood of particulate matter collecting in undesirable locations.

The term "port" as utilized herein includes apertures, connectors, fixtures, housings, and the like that comprise a surface or opening that can undesirably collect dust, dirt, particulate matter, and the like. The port or ports typically require cleaning and/or maintenance prior to being activated to transmit or otherwise manipulate a signal. The term "optical housing" is utilized periodically herein, for illustrative purposes only, as one possible form of a port. The invention is not limited to this one form of a port, but rather is intended to relate all ports within optical switches or other optical components as understood by one of ordinary skill in the art.

FIGS. 1 through 5, wherein like parts are designated by like reference numerals throughout, illustrate example embodiments of a baffle for occupying a port, according to aspects of the present invention. Although the present invention will be described with reference to the example embodiments illustrated in the figures, it should be understood that the invention can be embodied in many alternative forms of embodiment. In addition, one of ordinary skill in the art will appreciate different ways to alter the parameters of the embodiments disclosed, such as the size, shape, or type of elements or materials, in a manner still in keeping with the spirit and scope of the invention.

FIG. 1 illustrates one example embodiment of a port filler baffle 10 in accordance with aspects of the present invention. A panel 12 forms a major portion of the port filler baffle 10. The panel 12 can be fabricated of any number of different materials including wood, metal, composite, wood fiber, glass, plastic, ceramic, and the like. The surface of the panel 12 can be relatively smooth, rough, or have a plurality of indentations, elevated sections, openings, perforations, and the like. The surface of the panel 12 can additionally support different types of surface material in different locations of the surface to aid the flow of air as discussed previously. The panel 12 provides sufficient structure to enable the baffle to fill an otherwise empty space within the hardware chassis. The panel 12 takes the place of similarly shaped hardware components when such components are not required, and duplicates the shape of such components if necessary. Those skilled in the art will appreciate that the size and shape of the panel 12 may vary, depending on the size and shape of the component being replaced. It should be noted, however, that in some instances the port filler baffle 10 may vary in substantial respects relative to the components.

In addition, the port filler baffle 10 can have multiple pieces or sections. A single port filler baffle 10 can also be sized and dimensioned to take the place of multiple components if desired.

A mounting bracket 14 couples with one edge of the panel 12 to form the port filler baffle 10. A plurality of screws 16 fastens the mounting bracket 14 to the panel 12. However, one of ordinary skill in the art will understand that any number of different fasteners or joining materials can couple the mounting bracket 14 to the panel, such as rivets, welding, adhesives, other known fasteners and joining materials, and the like. The fasteners or joining materials can likewise mount the bracket 14 to the panel 12 in a number of different locations. In addition, the mounting bracket 14 can be integral with the structure of the panel 12.

The mounting bracket 14 includes two panel fasteners 18 at distal ends of the mounting bracket 14. The location of the panel fasteners 18 on the mounting bracket 14 depends on the location of the receiving portions (not shown) of the fasteners 18 on the particular structure to which the panel 12 mounts. The panel fasteners 18, likewise, can take the form of any number of different types of fasteners such as screws, thumb screws, hooks, snaps, and the like. The panel fasteners 18 serve to couple the mounting bracket 14 and thus the port filler baffle 10 to a structure such as a chassis 34 (See FIG. 5).

The mounting bracket 14 further includes two flanges 20 at distal ends of the mounting bracket 14. The flanges 20 serve to aid in positioning the port filler baffle 10 in the chassis 34, as later described herein.

The port filler baffle 10 also includes a bracket 22 coupled with the panel 12. A plurality of rivets 24 couple the bracket 22 to the panel 12. However, one of ordinary skill in the art will again recognize that any number of different fasteners can couple the bracket 22 to the panel 12, such as screws, welds, adhesives, other fasteners and the like.

The bracket 22 has a first support leg 23 having a first support leg flange 25. The first support leg 23 extends the length of the bracket 22, but one of ordinary skill in the art will appreciate that the first support leg 23 can take a number of different forms. The first support leg 23, for example, can include multiple legs extending to the panel 12, having apertures therebetween. The first support leg 23 can alternatively take the form of two support legs disposed at distal ends of the bracket 22. The solid wall version of the first support leg 23 as illustrated can serve the additional purpose of mimicking a component structure mounted to the panel 12, to affect the air flow provided by the cooling fans to cool the active components disposed relative to the port filler baffle 10.

The first support leg 23 includes the first support leg flange 25. The first support leg flange 25 also extends the length of the first support leg 23, and the bracket 22. However, the first support leg flange 25 can exist in many other forms and shapes, as understood by one of ordinary skill in the art. One feature of the first support leg flange 25 is the creation of a surface through which apertures 33 can be created to provide a fastening means, e.g., rivets 24, the ability to pass through the flange 25 and fasten the flange 25, and thus the first support leg 23, to the panel 12.

The first support leg 23 couples with a bracket surface 31. FIG. 1 illustrates the bracket surface 31 as a relatively smooth surface, however, the bracket surface 31 can be non-smooth, rough, wavy, supporting ridges, valleys, indentations, raised portions, and the like. The bracket surface 31 can take on the shape of one or more active components to simulate the components for purposes of maximizing the cooling effect of the air flowing over the bracket surface 31 on active components.

The bracket surface 31 further couples with a second support leg 27 that extends from the bracket surface 31 to the panel 12. The illustrations of the second support leg 27 show the leg being of similar shape and size to the first support leg 23. However, the second support leg 27 can take a number of different forms and shapes in a manner similar to, or different from, the first support leg 23. The second support leg 27 can have one or a plurality of legs. There can be one or more apertures or openings between each of the plurality of legs.

The second support leg 27 further couples with a second support leg flange 29. Similarly to the first support leg flange 25, the second support leg flange 29 also extends the length of the second support leg 27, and the bracket 22. The second support leg flange 25 can, likewise, exist in many other forms and shapes. The second support leg flange 29 also creates a surface through which apertures 33 can pass to provide fastening means, e.g., rivets 24, the ability to penetrate through the flange 29, fastening the flange 29 and the second support leg 27 to the panel 12.

The first support leg 23 is substantially perpendicular to the surface of the panel 12, while the second support leg 27 forms an acute angle with the surface of the panel 12. The angle of first support leg 23 relative to the panel 12 is determined by the position required of a pad 26 mounted to the first support leg 23, as discussed further below. The angle of the second support leg 27 helps to provide the bracket 22 with added strength along an axis substantially parallel with a majority of forces applied to the pad 26 when disposed according to the teachings of the invention. The angle of the second support leg 27 can vary, including being perpendicular to the panel 12 surface, as long as the material used to form the bracket 22 is sufficiently strong to prevent substantial deformation of the bracket 22 when installed.

The bracket 22 provides a support structure for the pad 26. The pad 26 illustrated is in the form of a rectangular three-dimensional element, however, the pad 26 can have any number of different shapes. Some possible shapes are illustrated in FIGS. 2A–2I. The pad 26 can be relatively planar (see FIGS. 2A, 2B, 2C, 2F, and 2G) and have the perimeter shape of a circle (see FIG. 2B), parallelogram (see FIGS. 2A, 2F, and 2H), multiple sided shape (see FIGS. 2A, 2C, 2F, 2G, 2H, and 2I), irregular shape (see FIG. 2G), and the like. The pad 26 can also have a concave or convex curvature (see FIGS. 2D and 2E). The pad 26 can be a solid three-dimensional shape, or can have a hollow section or sections (see FIG. 2E), or can have a cut-out section (see FIG. 2F). The pad 26 can also vary in relative thickness, being of different uniform thickness (see FIGS. 2A, 2B, 2C, 2E, 2F, and 2G) or of different non-uniform thickness (see FIGS. 2H and 2I). The actual shape of the pad 26 in each instance is at least partially defined by the shape of the port that it seals, in that the pad 26 must extend to or beyond the edges of the port to ensure the desired seal is attained when the pad 26 is in the proper position.

Figure 5:
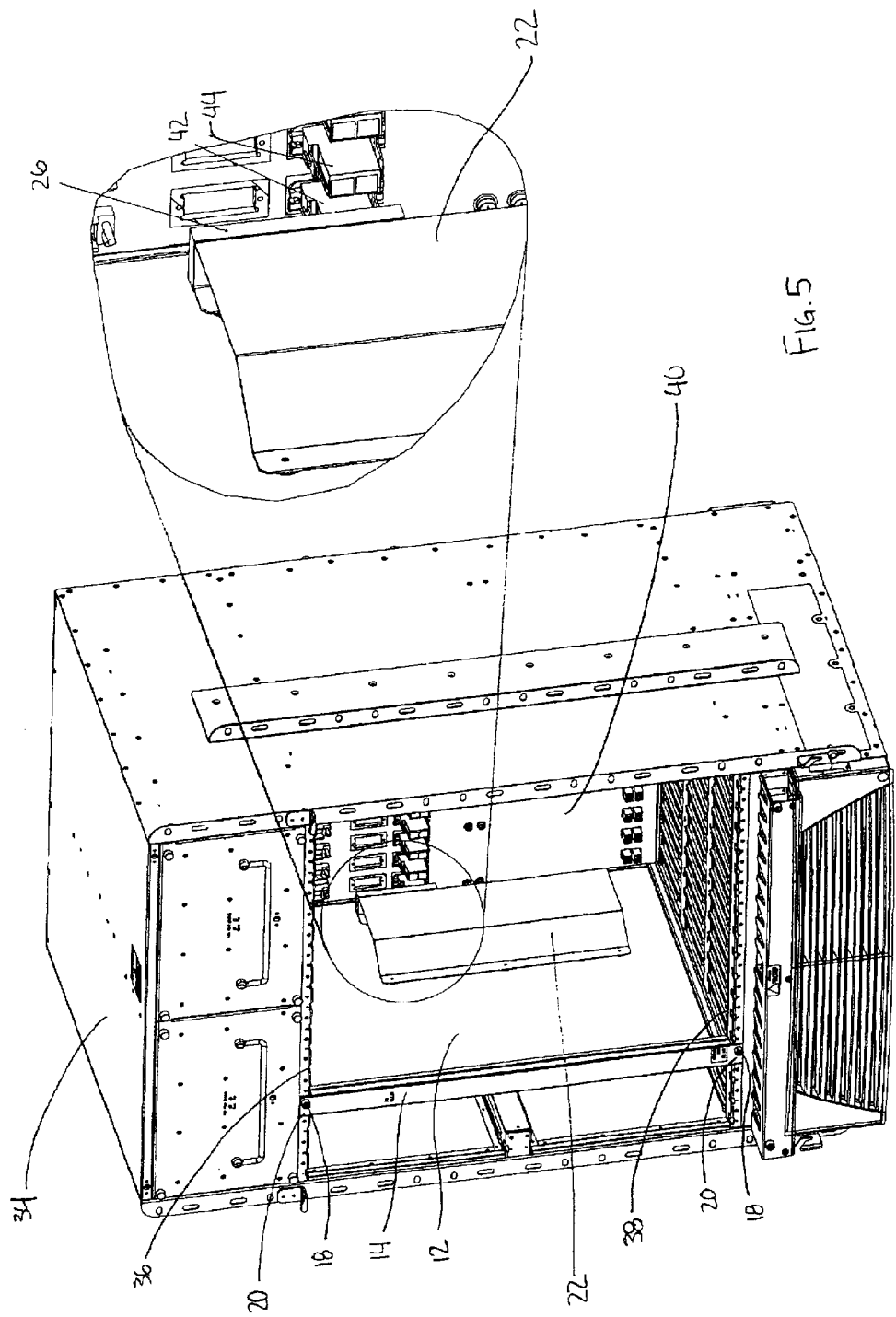
FIG. 5 is a perspective view of a hardware component chassis according to one embodiment of the invention.

The pad 26 serves to press against, and seal, ports (e.g., optical housings 42) within the chassis 34 (See FIG. 5). The pad has material properties including compressibility and some shape memory, such that when the pad 26 presses against an object or an object presses against the pad 26, the pad deforms slightly enveloping the object pressing against the pad and forming a relatively tight seal between the pad 26 and the object. The pad can therefore be made of foam, film, other plastic or rubber materials, cloth, wood fiber, and other similar materials having the requisite properties.

The angle of the pad 26 relative to the optical housings 42 affects the ability of the pad 26 to effectively hinder the particulate matter from entering the optical housings 42. If the angle of the pad 26 creates a gap between portions of the pad 26 and portions of the optical housings 42, the effectiveness of the pad 26 is greatly diminished. Therefore, the angle of the pad 26, and accordingly the angle of the support for the pad, i.e., the first support leg 23, must enable the pad 26 to align appropriately with the optical housings 42 to sufficiently hinder particulate matter from entering the optical housings 42.

The port filler baffle 10 further includes an upper tongue 28 disposed along a top edge of the port filler baffle 10, and a lower tongue 30 disposed along a lower edge of the port filler baffle 10. The upper tongue 28 and the lower tongue 30 couple with upper and lower grooves within the chassis 34 as will be described further at a later point herein. It should be noted that the tongue and groove structure illustrated is merely one example embodiment for mounting the port filler baffle 10 in the chassis 34. The port filler baffle 10 can utilize a different structure from the upper tongue 28 and the lower tongue 30, such as simply sliding a flat edge into a U-shaped bracket, placing the port filler baffle 10 inside the chassis 34 and fastening it in place with no additional supports, and the like, as understood by one of ordinary skill in the art.

Figure 3:
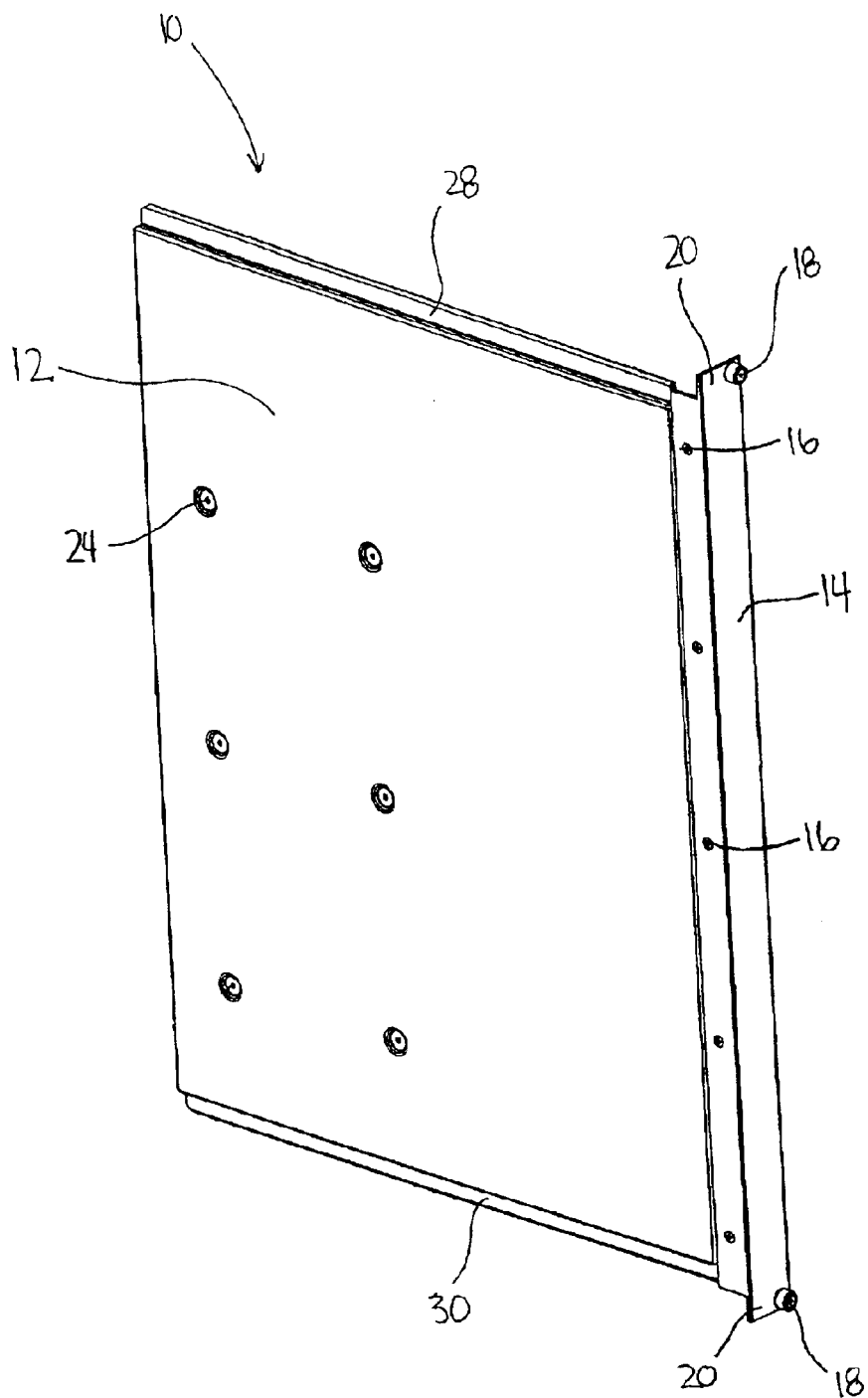
FIG. 3 is a perspective illustration of the port filler baffle of FIG. 1 according to one embodiment of the invention.

FIG. 3 illustrates a backside of the port filler baffle 10. The screws 16 that couple the mounting bracket 14 to the panel 12 passes through to this backside of the port filler baffle 10 illustrated. The rivets 24 that mount the bracket 22 to the panel 12 pass through this backside of the port filler baffle 10. Both the screws 16 and the rivets 24 do not necessarily need to pass completely through the panel 12 of the port filler baffle 10. Adhesives or welds can mount the mounting bracket 14 and/or the bracket 22 to the backside of the port filler baffle 10, such that the port filler baffle 10 remains clear of apertures and fasteners, if desired. The inclusion of the apertures and fasteners may otherwise affect the flow of air across the port filler baffle 10 in an undesirable manner.

Figure 4:
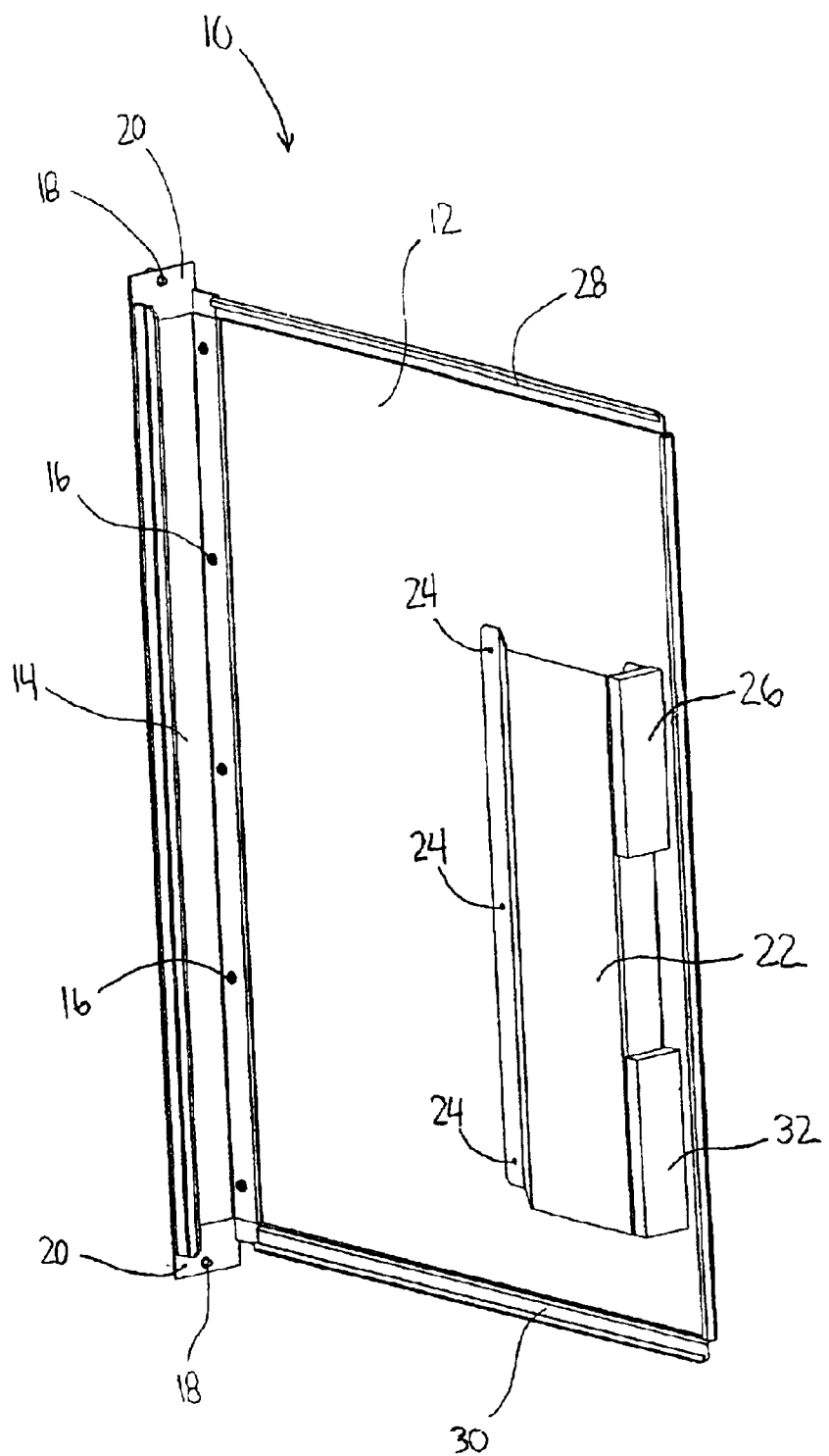
FIG. 4 is a perspective view of a port filler baffle according to another embodiment of the invention.

FIG. 4 illustrates another embodiment of the invention. The port filler baffle 10 includes the panel 12, and the mounting bracket 14. The mounting bracket 14 couples with the panel 12 through use of a plurality of screws 16. Panel fasteners 18 pass through the flange 20 of the mounting bracket to enable the coupling of the mounting bracket 14 to the chassis 34.

The bracket 22 mounts to the panel 12 with rivets 24, or other known fastener types. The bracket 22 as illustrated, supports two pads 26 and 32. This arrangement of pads 26 and 32 enables the bracket 22 of the port filler baffle to seal more than one aperture or port located at approximate distances equivalent to the distances between the two pads 26 and 32. One of ordinary skill in the art will appreciate that the number of different pads that can mount to the bracket 22 can vary, and the pads can mount in a number of different arrangements to appropriately match up with a plurality of apertures, ports, or optical housings to hinder the flow of particulate matter into such locations.

The pad 26 and 32 as discussed herein can be made of a number of different materials including foam, silicone foam, rubber, flame retardant compressible material, and the like.

FIG. 5 illustrates an example chassis 34 containing one or more port filler baffles 10. The chassis 34 is typically made of metal, such as steel or aluminum, or alternatively plastic or composite materials, and the like.

The chassis 34, according to one embodiment, includes an upper groove 36 and a lower groove 38 extending from a front portion to a back portion of the chassis 34. In a rear portion of the chassis 34, a backplane 40 supports a plurality of elements and modules for carrying out the design function of the chassis 34. For example, the chassis 34 can be a chassis of an optical switch. In such an instance, the backplane 40 supports a plurality of optical housings such as optical housing 42 and optical housing 44. These optical housings 42 and 44 serve to connect various optical fibers within the chassis 34 forming the structure of the switch.

In operation, according to the illustrated embodiment, the port filler baffle 10 slides into the chassis 34 with the lower tongue 30 sliding along the lower groove 38 and the upper tongue 28 sliding along the upper groove 36. The tongue and groove combination properly aligns the port filler baffle 10 within the chassis 34. As the port filler baffle 10 moves into proper position, the flange 20 interferes with a frame of the chassis 34, preventing the port filler baffle 10 from sliding further inward to the chassis 34. Coinciding with this position as dictated by the location of the flange 20, the pad 26 or pads 26 and 32 press up against the unutilized optical housings 42 and 44. By pressing up against the optical housing 42 and 44, the pad 26 compresses and forms a seal about the edges of the optical housing 42. This seal substantially hinders particulate matter from entering the optical housing 42, while the optical housing 42 is not in use.

The port filler baffle 10 as described herein is suitable for filling otherwise unutilized space in the chassis 34 of a device. The port filler baffle 10 maintains known features of re-directing airflow through the chassis. The port filler baffle 10 takes the place of internal components having active elements, without having to include the more expensive components when there is no use for them in the device housed by the chassis. The port filler baffle 10 takes up space equivalent to an internal component such that the air flow within the hardware component chassis propagates through the design cooling path. The addition of the baffles helps to maintain proper cooling levels. In addition, the inclusion of the bracket 22 and the one or more pads 26 and 32 supported by the bracket 22, serves to compress against unutilized ports (e.g., apertures, optical housings, and the like) to hinder unwanted particulate matter from entering these areas and collecting. The use of the one or more pads 26 and 32 significantly reduces the amount of cleaning required by a technician when and if the unutilized ports are brought into service. The reduced requirement for cleaning, and the reduced burden on the technician, improves the likelihood that the device will operate properly without failure and reduces the time and thus the cost of having the technician implement the task of activating the previously unutilized components.

Numerous modifications and alternative embodiments of the invention will be apparent to those skilled in the art in view of the foregoing description. Accordingly, this description is to be construed as illustrative only and is for the purpose of teaching those skilled in the art the best mode for carrying out the invention. Details of the structure may vary substantially without departing from the spirit of the invention, and exclusive use of all modifications that come within the scope of the appended claims is reserved. It is intended that the invention be limited only to the extent required by the appended claims and the applicable rules of law.

What is claimed is:

1. A baffle for occupying a slot within a chassis having a plane with at least one aperture, comprising:
   an assembly sized and dimensioned to occupy an interior portion of the chassis;
   a bracket coupled with the assembly; and
   an aperture filler coupled with the bracket and disposed to fill an unutilized aperture of the plane and hinder particulate intrusion into the unutilized aperture of the plane when positioned in the chassis.

2. The baffle according to claim 1, wherein the assembly is a panel assembly.

3. The baffle according to claim 1, further comprising a groove formed within the chassis to at least partially support the assembly.

4. The baffle according to claim 3, wherein the assembly is configured to slidingly engage with the groove to mount the baffle within the chassis.

5. The baffle according to claim 3, wherein the assembly comprises a tongue-shaped edge suitable for sliding into the groove of the chassis.

6. The baffle according to claim 1, wherein the plane comprises one of a backplane and a mid-plane.

7. The baffle according to claim 1, wherein the aperture is disposed within the plane.

8. The baffle according to claim 1, wherein the assembly comprises a mounting bracket.

9. The baffle according to claim 8, wherein the mounting bracket is removably and replaceably coupled with the assembly.

10. The baffle according to claim 8, wherein the mounting bracket comprises at least one fastener suitable for coupling the assembly to the chassis.

11. The baffle according to claim 1, wherein the aperture filler comprises at least one pad mounted to the bracket.

12. The baffle according to claim 11, wherein the pad is sized and dimensioned to substantially seal the aperture.

13. The baffle according to claim 11, wherein the pad is constructed of a deformable material suitable for sealing.

14. The baffle according to claim 11, wherein the pad is constructed of silicone foam.

15. The baffle according to claim 11, wherein the pad is mounted to the bracket utilizing an adhesive.

16. The baffle according to claim 1, wherein the aperture filler presses against the unutilized aperture as the assembly is inserted into the slot.

17. The baffle according to claim 16 wherein the assembly is inserted in a direction against the unutilized aperture.

18. The baffle according to claim 1 wherein the assembly takes a shape of a component being replaced.

19. The baffle according to claim 1, wherein the bracket takes a shape of one or more components to maximize the cooling effect of air flowing over the bracket.

20. The baffle according to claim 1, wherein the assembly is sized and dimensioned to take space equivalent to a component being replaced so that air flow within the chassis propagates trough a design cooling path.

21. The baffle according to claim 1, wherein the assembly includes indentations, elevated sections or perforations to aid air flow with the chassis.

22. The baffle according to claim 1, wherein the bracket duplicates structure of a corresponding component mounted to the assembly to affect air flow within the chassis.

23. An optical switch, comprising:
   a chassis;
   a plane disposed within the chassis, the plane supporting one or more ports, wherein at least one of the one or more ports is unutilized;
   a port filler baffle disposed within the chassis and having a pad;
   wherein the pad of the port filler baffle is disposed to press against the at least one unutilized port to fill the port and hinder the entrance of particulate matter into the port when the port filler baffle is installed into the chassis.

24. The optical switch according to claim 23, wherein the plane comprises one of a backplane and a mid-plane.

25. The optical switch according to claim 23, wherein the one or more ports comprise one or more of apertures, connectors, fixtures, and housings.

26. An assembly, comprising:
   a chassis;
   a plane disposed within the chassis, the plane having one or more apertures;

a panel assembly disposed within the chassis;

a support bracket disposed on the panel assembly;

an aperture filler disposed on the support bracket such that the aperture filler fills at least one of the apertures and hinders particulate matter from entering the aperture.

27. The assembly according to claim 26, wherein the panel assembly comprises a tongue-shaped edge suitable for sliding into a groove of the chassis to mount the panel assembly.

28. The assembly of claim 26, wherein the plane comprises one of a backplane and a mid-plane.

29. The panel assembly of claim 26, wherein the panel assembly comprises a port filler baffle.

30. The panel assembly of claim 26, wherein the aperture filler comprises at least one pad.

31. The panel assembly of claim 30, wherein the pad is constructed of a deformable material suitable for sealing.

32. The panel assembly according to claim 30, wherein the pad is constructed of silicone foam.

33. The panel assembly according to claim 30, wherein the pad is mounted to the panel assembly utilizing an adhesive.

* * * * *